(12) United States Patent
Su et al.

(10) Patent No.: US 10,109,522 B2
(45) Date of Patent: *Oct. 23, 2018

(54) METHOD FOR FORMING SEMICONDUCTOR STRUCTURE

(71) Applicant: Taiwan Semiconductor Manufacturing Company Limited, Hsin-Chu (TW)

(72) Inventors: Yi-Nien Su, Hsinchu (TW); Hsiang-Wei Lin, New Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 48 days.

This patent is subject to a terminal disclaimer.

(21) Appl. No.: 15/242,854

(22) Filed: Aug. 22, 2016

(65) Prior Publication Data

US 2016/0358816 A1    Dec. 8, 2016

Related U.S. Application Data

(60) Continuation of application No. 14/797,234, filed on Jul. 13, 2015, now Pat. No. 9,425,091, which is a
(Continued)

(51) Int. Cl.
*H01L 21/00* (2006.01)
*H01L 21/768* (2006.01)
(Continued)

(52) U.S. Cl.
CPC .. *H01L 21/76877* (2013.01); *H01L 21/31111* (2013.01); *H01L 21/31144* (2013.01);
(Continued)

(58) Field of Classification Search
CPC ........... H01L 21/7682; H01L 21/31144; H01L 21/76807; H01L 21/76802
See application file for complete search history.

(56) References Cited

U.S. PATENT DOCUMENTS 9,425,091 B2 * 8/2016 Su ..................... H01L 23/53228
2002/0187629 A1   12/2002 Huang et al.
(Continued)

FOREIGN PATENT DOCUMENTS

TW          201011683 A        3/2010

OTHER PUBLICATIONS

Corresponding Chinese Application No. 201310027743.3, Chinese Office action dated Dec. 17, 2015, 8 pages.
(Continued)

*Primary Examiner* — Ngan Ngo
(74) *Attorney, Agent, or Firm* — Cooper Legal Group, LLC (57) ABSTRACT

One or more techniques or systems for forming a semiconductor structure having a gap are provided herein. In some embodiments, a gap is formed between a first etch stop layer (ESL) and an ESL seal region. For example, the gap is formed by removing a portion of a low-k (LK) dielectric region above an oxide region and removing the oxide region. In some embodiments, the oxide region below the LK dielectric region facilitates removal of the LK dielectric region, at least because the oxide region enhances a bottom etch rate of a bottom of the LK dielectric region such that the bottom etch rate is similar to a wall etch rate of a wall of the LK dielectric region.

20 Claims, 11 Drawing Sheets

Related U.S. Application Data division of application No. 13/659,109, filed on Oct. 24, 2012, now Pat. No. 9,082,770.

(51) Int. Cl.
*H01L 23/532* (2006.01)
*H01L 21/311* (2006.01)
*H01L 23/528* (2006.01)
*H01L 23/522* (2006.01)

(52) U.S. Cl.
CPC ........ *H01L 21/768* (2013.01); *H01L 21/7682* (2013.01); *H01L 21/76802* (2013.01); *H01L 21/76807* (2013.01); *H01L 21/76819* (2013.01); *H01L 23/528* (2013.01); *H01L 23/5222* (2013.01); *H01L 23/5226* (2013.01); *H01L 23/53228* (2013.01); *H01L 23/53295* (2013.01); *H01L 2924/0002* (2013.01)

(56) References Cited

U.S. PATENT DOCUMENTS

| | | |
|---|---|---|
| 2008/0012069 A1 | 1/2008 | Mizokuchi |
| 2009/0309230 A1 | 12/2009 | Cui et al. |
| 2015/0262860 A1* | 9/2015 | Kao .................... H01L 21/7682 257/774 |
| 2015/0348945 A1* | 12/2015 | Or-Bach ............... H01L 21/743 257/384 |

OTHER PUBLICATIONS

Corresponding Korean Application No. 10-2013-0008030, Korean Office action dated Jun. 20, 2014, 3 pages.
Korean Office Action cited in Korean Application No. 10-2013-0008030 dated Dec. 16, 2013, 8 pgs.

* cited by examiner

FIG. 11

METHOD FOR FORMING SEMICONDUCTOR STRUCTURE

RELATED APPLICATION

This application is a continuation of U.S. Non-Provisional patent application Ser. No. 14/797,234, titled "METHOD FOR FORMING SEMICONDUCTOR STRUCTURE" and filed on Jul. 13, 2015, which is a divisional of U.S. Non-Provisional patent application Ser. No. 13/659,109, titled "DAMASCENE GAP STRUCTURE" and filed on Oct. 24, 2012. U.S. Non-Provisional patent applications Ser. No. 14/797,234 and 13/659,109 are incorporated herein by reference.

BACKGROUND

Generally, a traditional damascene gap structure is associated with a gap, such as a gap in a dielectric region, for example. The gap is generally formed by etching a portion of the dielectric region. However a first etch rate, such as a bottom etch rate of a bottom of the dielectric region, is often different from a second etch rate, such as a wall etch rate of a wall of the dielectric region. Therefore, the gap of the traditional damascene gap structure is often associated with an undesirable profile, at least because the different etch rates of the dielectric region result in residue dielectric within the gap, for example.

BRIEF DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 1:
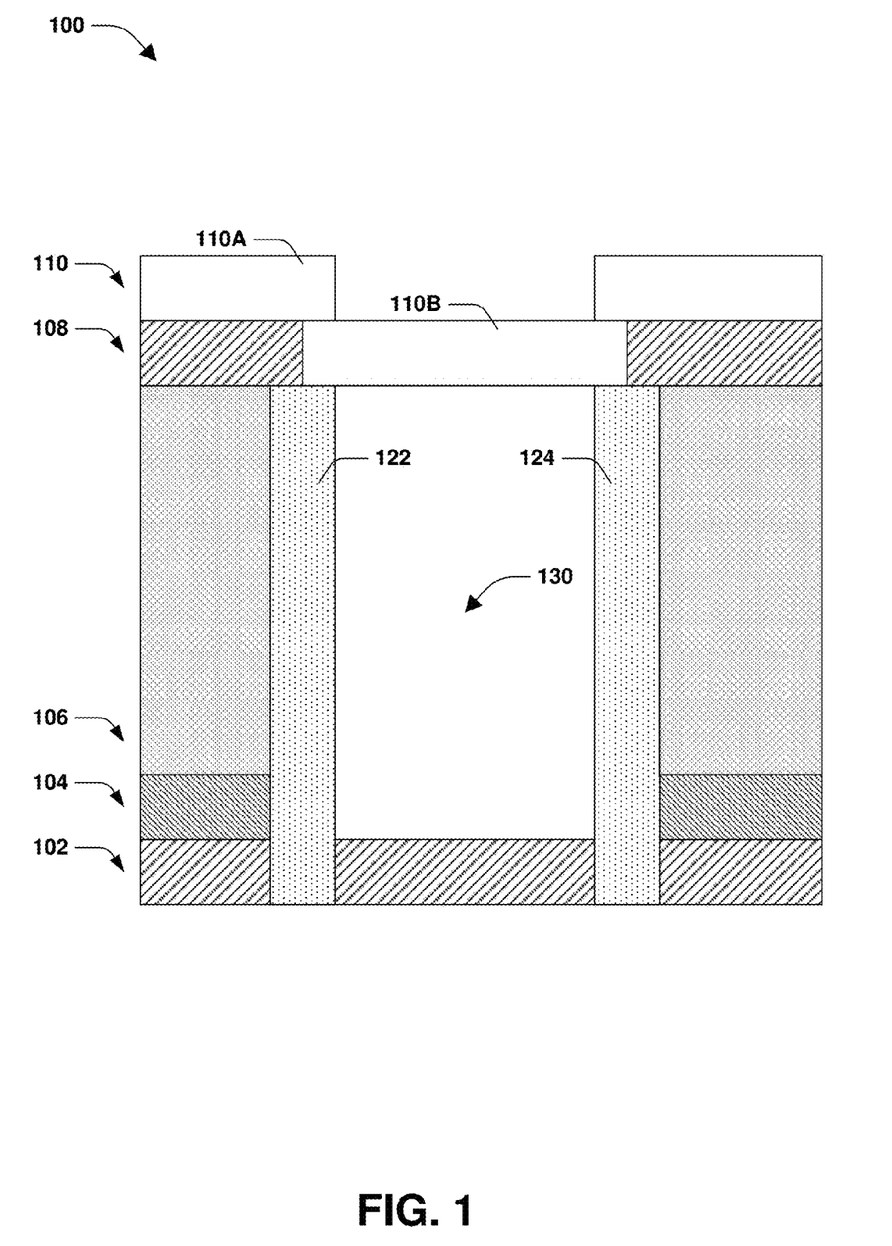
FIG. 1 is a cross-sectional view of an example damascene gap structure, according to some embodiments.

FIG. 1 is a cross-sectional view of an example damascene gap structure 100, according to some embodiments. In some embodiments, the damascene gap structure 100 of FIG. 1 comprises a first etch stop layer (ESL) 102. In some embodiments, an oxide region 104 is located above at least some of the first ESL 102. Additionally, a low-k (LK) dielectric region 106 is located above the oxide region 104. In some embodiments, a second ESL 108 is located above the LK dielectric region 106. For example, the second ESL 108 is a metal diffusion barrier. In some embodiments, the second ESL 108 is formed by deposition, for example. In some embodiments, a first ESL seal region 110A is located above the second ESL 108. Additionally, a second ESL seal region 110B is flush with the second ESL 108. In some embodiments, the second ESL seal region 110B comprises a different height than the second ESL 108, but the second ESL seal region 110B and the second ESL 108 are flush with respect to a top of the LK dielectric region 106. In some embodiments, at least a portion of the first ESL seal region 110A is located above at least a portion of the second ESL seal region 110B. For example, the first ESL seal region 110A is connected to the second ESL seal region 110B. In some embodiments, an ESL seal region 110 is a continuous region and comprises the first ESL seal region 110A and the second ESL seal region 110B.

In some embodiments, the damascene gap structure 100 comprises a gap 130 between the first ESL 102 and the second ESL seal region 110B. For example, the gap 130 of the damascene gap structure 100 is formed based on removing LK dielectric material in gap 130. In some embodiments, the LK dielectric material in the gap 130 is located above an oxide region within the gap (not shown). For example, the oxide region is not shown at least because the oxide region within the gap is removed during gap 130 formation.

Accordingly, this oxide region (not shown) associated with gap 130 facilitates removal of the LK dielectric material within gap 130, at least because the oxide region enhances etch rates associated with the LK dielectric material. For example, dielectric material along a wall, such as a first metal line 122, is associated with a wall etch rate. Additionally, dielectric material along a bottom portion, such as along the first ESL 102, is associated with a bottom etch rate. Typically, the wall etch rate is different from the bottom etch rate. However, the oxide region within the gap (not shown) enables the bottom etch rate to be similar to the wall etch rate. For example, processed LK dielectric material is generally associated with a faster etch rate, such as a processed etch rate, than non-processed LK dielectric material associated with a non-processed etch rate, thus making the processed LK dielectric material more easily removable than the non-processed LK dielectric material. For example, the wall etch rate is associated with the processed LK etch rate. Accordingly, the oxide region of the gap 130 mitigates LK dielectric residue associated with the gap 130, at least because the oxide region of the gap enables the bottom etch rate to be similar to the faster, processed LK etch rate. Accordingly, the oxide region within the gap (not shown) enables LK dielectric material within a bottom portion of the gap (not shown) to be removed at a faster rate, such as a rate similar to the wall etch rate of the LK dielectric material against a wall of the gap 130. In this way, LK dielectric material of the gap 130 is removed to form gap 130 in an efficient manner.

In some embodiments, the damascene gap structure 100 comprises a first metal line 122 and a second metal line 124. For example, at least one of the first metal line 122 or the second metal line 124 is formed under at least one of the second ESL 108 or the second ESL seal region 110B. Additionally, at least one of the first metal line 122 or the second metal line 124 is formed through the first ESL 102, for example. It will be appreciated that the gap 130 of the damascene gap structure 100 separates the LK dielectric region 106 into a first LK dielectric region on one side of the gap 130 and a second LK dielectric region on another side of the gap 130. Similarly, the gap 130 separates the oxide region 104 into a first oxide region on one side of the gap 130 and a second oxide region on another side of the gap 130. However, it will be appreciated that the LK dielectric region 106 comprises the first LK dielectric region and the second LK dielectric region. Similarly, the oxide region 104 comprises the first oxide region and the second oxide region. Therefore, it will be appreciated that a region or a layer is not necessarily continuous or flush, for example. In some embodiments, at least one of the first metal line 122, the second metal line 124, or the gap 130 forms a break in at least one of the first ESL 102, the oxide region 104, or the LK dielectric region 106. Similarly, the second ESL 108 is not continuous in some embodiments. Additionally, the ESL seal region 110 is not flush in some embodiments. For example, the ESL seal region 110 is not flush at least because the first ESL seal region 110A is located above the second ESL seal region 110B.

In some embodiments, at least one of the first ESL 102 or the second ESL 108 comprises a dielectric material. Additionally, a dielectric constant associated with the LK dielectric region 106 is less than five in some embodiments. In some embodiments, at least one of the first metal line 122 or the second metal line 124 comprises copper. In some embodiments, the gap 130 of the damascene gap structure 100 comprises an air gap. For example, the air gap is associated with a dielectric constant=1. Accordingly, the air gap of the damascene gap structure 100 facilitates improved RC performance with respect to a gap 130 associated with a dielectric constant higher than 1, for example. However, gap materials other than air are contemplated. In some embodiments, the first ESL 102 is configured to provide support, such as physical or mechanical support, for at least one of the first metal line 122 or the second metal line 124. For example, the first ESL 102 mitigates dislocation of respective metal lines 122 or 124.

Figure 2:
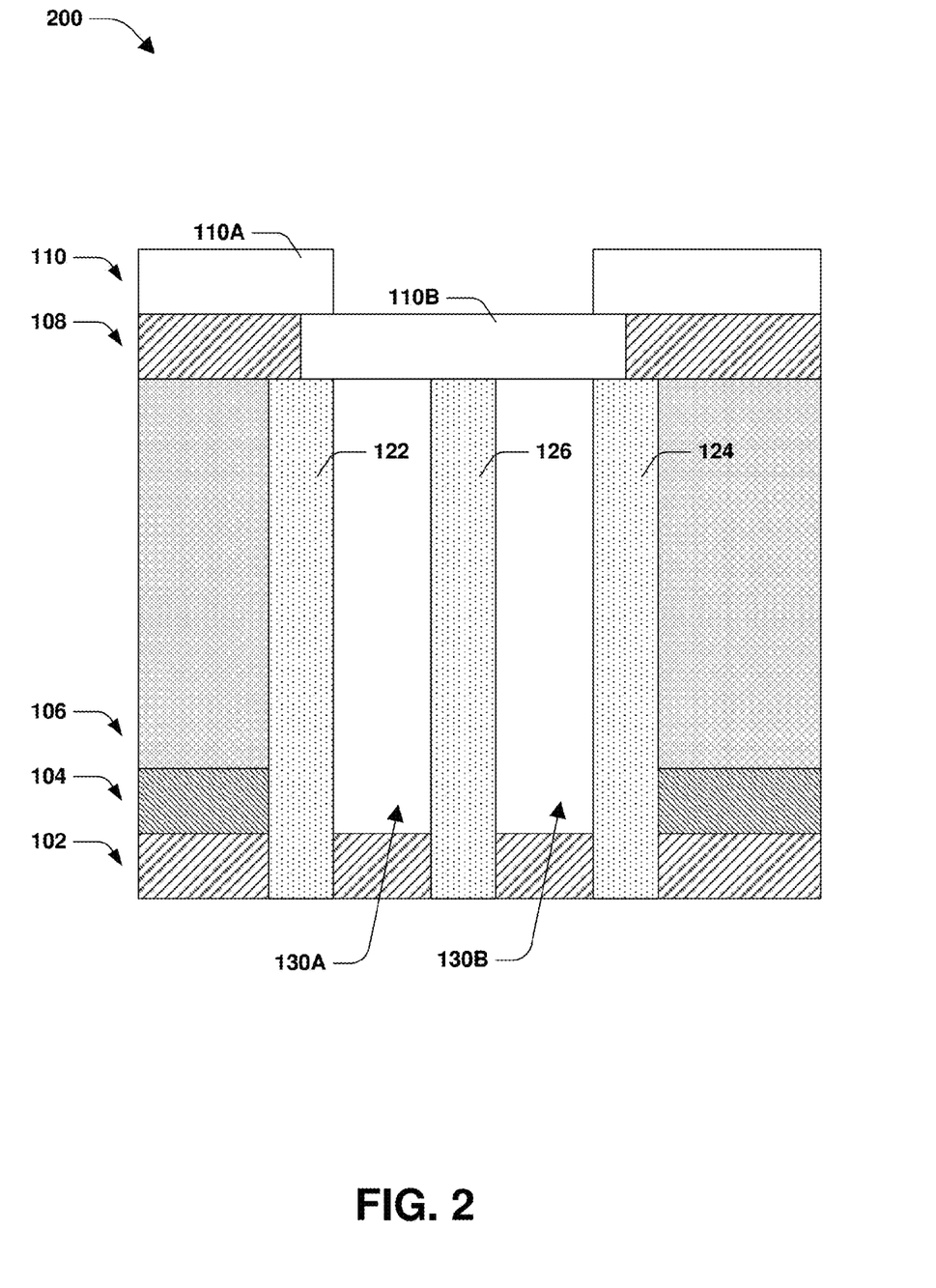
FIG. 2 is a cross-sectional view of an example damascene gap structure, according to some embodiments.

FIG. 2 is a cross-sectional view of an example damascene gap structure 200, according to some embodiments. In some embodiments, FIG. 2 is similar to FIG. 1, except that the damascene gap structure 200 of FIG. 2 comprises a third metal line 126. For example, the third metal line 126 is formed under the second ESL seal region 110B and through the first ESL 102. In some embodiments, the third metal line 126 is configured to form a first gap 130A and a second gap 130B based on dividing the gap 130, for example.

It will be appreciated that FIGS. 3-9 are cross-sectional views of an example damascene gap structure during formation, according to some embodiments, and that respective figures are described with respect to one another. FIG. 3A is a cross-sectional view of an example damascene gap structure 300A during formation, according to some embodiments. For example, damascene gap structure 300A comprises one or more additional regions 306. In some embodiments, at least some of the one or more additional regions 306 comprise at least one of an etch stop layer (ESL), a low-k (LK) dielectric region, an ESL seal region, an oxide region, etc. In some embodiments, a first ESL 102 is formed above the one or more additional regions 306. For example, the first ESL 102 comprises a dielectric material. Additionally, an oxide region 104 is formed above the first ESL 102. For example, the oxide region 104 comprises oxide. Additionally, a LK dielectric region 106 is formed above the oxide region 104, such that the oxide region 104 is between the LK dielectric region 106 and the first ESL 102. In some embodiments, the LK dielectric region 106 comprises dielectric material. For example, the dielectric material of the LK dielectric region 106 is associated with a dielectric constant less than five. In some embodiments, a hard mask (HM) region 340 is formed over the LK dielectric region 106. In some embodiments, at least one the HM region 340, the LK dielectric region 106, the oxide region 104, the first ESL 102, or at least some of the one or more additional regions 306 are formed by deposition.

Figure 3A:
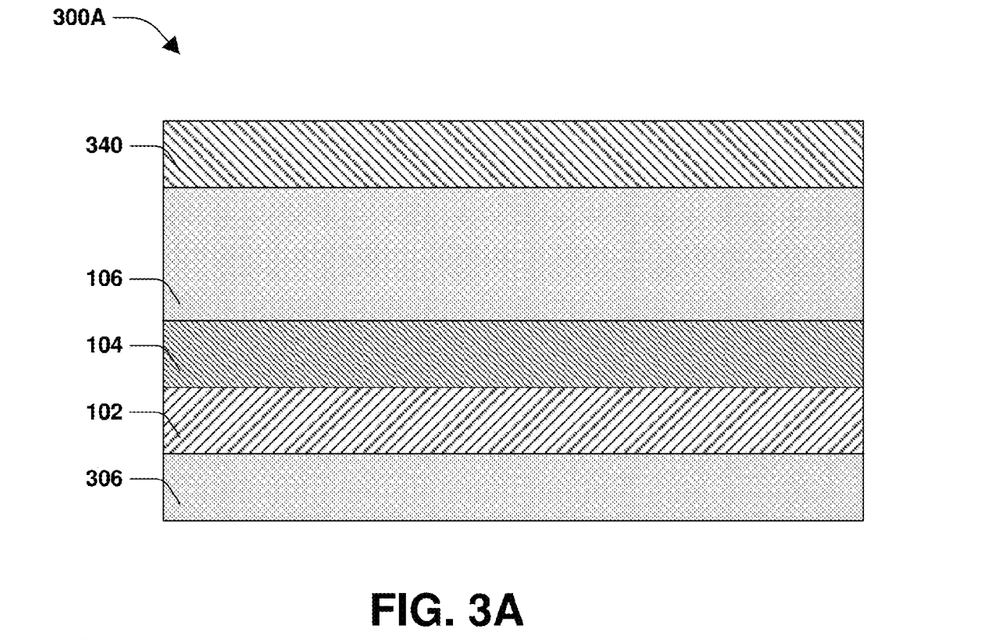
FIG. 3A is a cross-sectional view of an example damascene gap structure during formation, according to some embodiments.
Figure 3B:
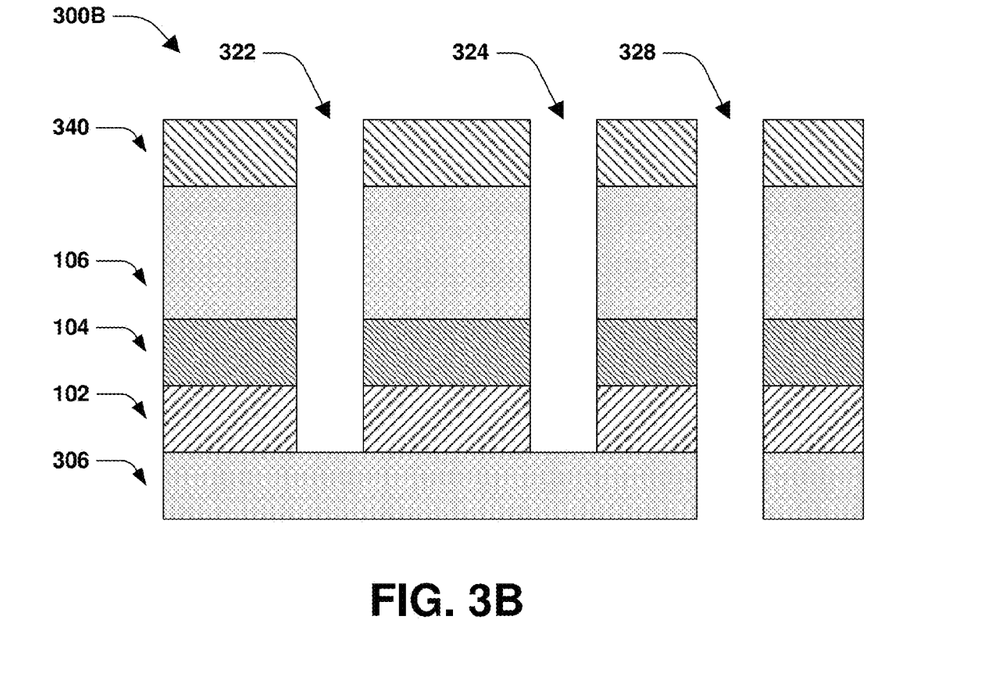
FIG. 3B is a cross-sectional view of an example damascene gap structure during formation, according to some embodiments.

FIG. 3B is a cross-sectional view of an example damascene gap structure 300B during formation, according to some embodiments. For example, the damascene gap structure 300B is the damascene gap structure 300A of FIG. 3A after etching is performed. In some embodiments, the etching forms a first trench 322, a second trench 324, or a contact space 328. For example, at least one of the first trench 322 or the second trench 324 is formed by etching at least a portion of at least one of the HM region 340, the LK dielectric region 106, the oxide region 104, or the first ESL 102. For another example, the contact space 328 is formed by etching at least a portion of at least one of the HM region 340, the LK dielectric region 106, the oxide region 104, the first ESL 102, or at least some of the one or more additional regions 306. In some embodiments, a single damascene approach is used, and merely the first trench 322 and the second trench 324 are formed. Accordingly, it will be appreciated that when the single damascene approach is used, the contact space 328 or via 128 is not present in FIGS. 3-9, for example. In other embodiments, such as a dual damascene approach, the first trench 322, the second trench

324, and the contact space 328 are formed in a concurrent fashion. In some embodiments, an ESL, such as a middle ESL facilitates formation of the contact space 328, such that etching associated with contact space 328 stops at the middle ESL.

Figure 4A:
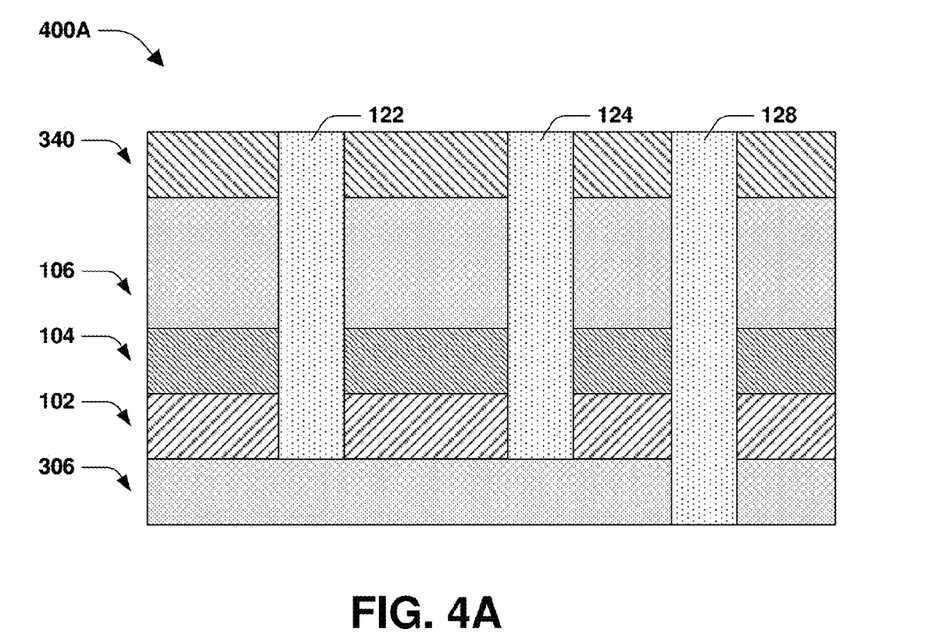
FIG. 4A is a cross-sectional view of an example damascene gap structure during formation, according to some embodiments.
Figure 4B:
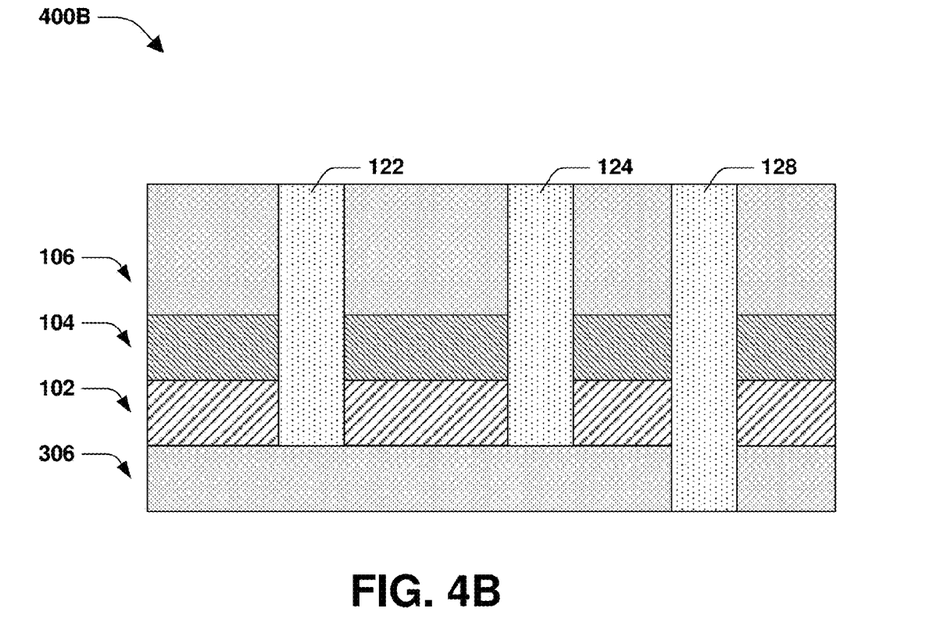
FIG. 4B is a cross-sectional view of an example damascene gap structure during formation, according to some embodiments.

FIG. 4A is a cross-sectional view of an example damascene gap structure 400A during formation, according to some embodiments. For example, the first trench 322, the second trench 324, and the contact space 328 of FIG. 3B are filled with metal to form a first metal line 122, a second metal line 124, and a via 128, respectively. In some embodiments, at least one of the first metal line 122, the second metal line 124, or the via 128 comprise copper. FIG. 4B is a cross-sectional view of an example damascene gap structure 400B during formation, according to some embodiments. For example, the damascene gap structure 400B is the damascene gap structure 400A of FIG. 4A after chemical-mechanical planarization (CMP). In some embodiments, the HM region 340 is removed based on CMP. Additionally, at least a portion of at least one of the first metal line 122, the second metal line 124, or the via 128 is removed based on CMP. For example, a portion of the first metal line 122 above the LK dielectric region 106 is removed. Similarly, portions of the second metal line 124 or the via 128 above the LK dielectric region 106 are removed via CMP.

Figure 5A:
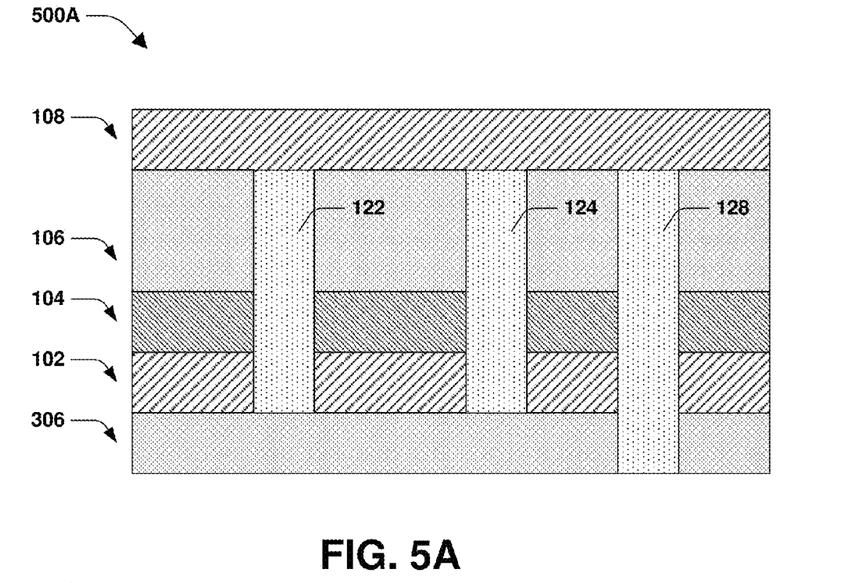
FIG. 5A is a cross-sectional view of an example damascene gap structure during formation, according to some embodiments.
Figure 5B:
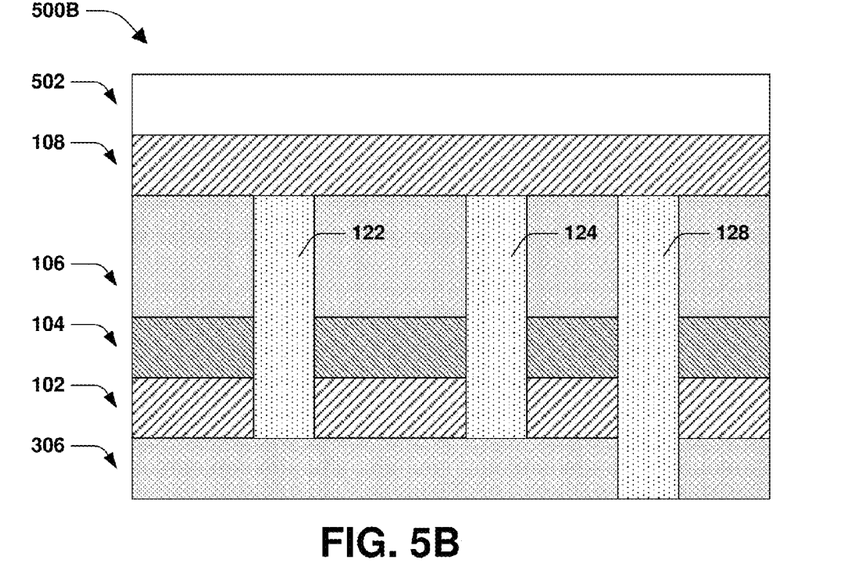
FIG. 5B is a cross-sectional view of an example damascene gap structure during formation, according to some embodiments.

FIG. 5A is a cross-sectional view of an example damascene gap structure 500A during formation, according to some embodiments. For example, the damascene gap structure 500A of FIG. 5 comprises a second ESL 108 formed over at least one of the LK dielectric region 106, the first metal line 122, the second metal line 124, or the via 128. In some embodiments, the second ESL 108 acts as a metal diffusion barrier, thus mitigating metal from at least one of the first metal line 122, the second metal line 124, or the via 128 from diffusing into other regions. FIG. 5B is a cross-sectional view of an example damascene gap structure 500B during formation, according to some embodiments. In FIG. 5B, a photo resist (PR) region 502 is formed over the second ESL 108 formed in FIG. 5A.

Figure 6A:
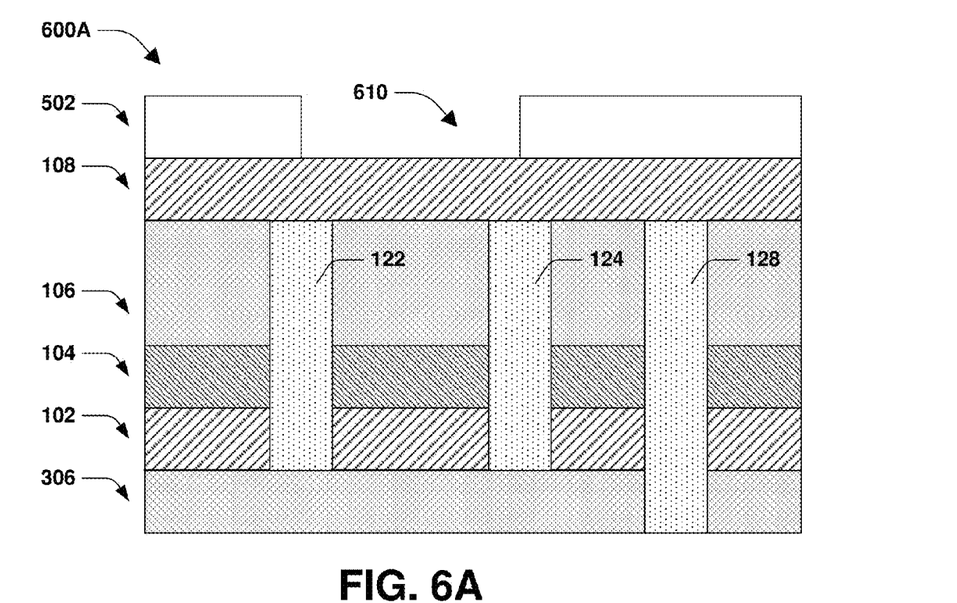
FIG. 6A is a cross-sectional view of an example damascene gap structure during formation, according to some embodiments.
Figure 6B:
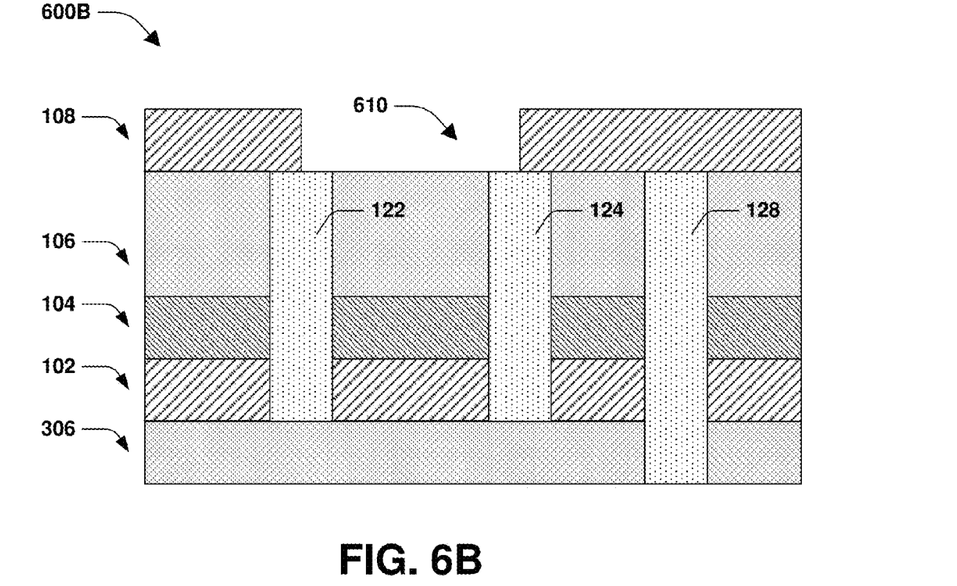
FIG. 6B is a cross-sectional view of an example damascene gap structure during formation, according to some embodiments.

FIG. 6A is a cross-sectional view of an example damascene gap structure 600A during formation, according to some embodiments. For example, the PR region 502 is patterned, as illustrated at 610. In some embodiments, 610 corresponds to an area where gap 130 of FIG. 7A will be formed, for example. In some embodiments, the PR region 602 is patterned 610 based on a mask. FIG. 6B is a cross-sectional view of an example damascene gap structure 600B during formation, according to some embodiments. In FIG. 6B, the patterned PR region 502 of FIG. 6A is removed, such as after the second ESL 108 is patterned 610. In some embodiments, a portion of the second ESL 108 is removed during patterning, such as a portion associated with 610. In some embodiments, 610 is above at least some of at least one of the first metal line 122 or the second metal line 124. Additionally, 610 is above a region where gap 130 is to be formed. It will be appreciated that in some embodiments, the oxide region 104 facilitates removal of the LK dielectric region 106, such as LK dielectric material associated with 610. In some embodiments, the oxide region 104 enables LK dielectric material along an interface of the oxide region 104 and the LK dielectric region 106 to comprise an etch rate similar to that of an etch rate of LK dielectric material along an interface of the first metal line 122 and the LK dielectric region 106. For example, the etch rate for LK dielectric material along the interface of the first metal line 122 and the LK dielectric region 106 is a wall etch rate. Additionally, the etch rate for LK dielectric material along the interface of the second metal line 124 and the LK dielectric region 106 is a wall etch rate . For another example, the etch rate for LK dielectric material along the interface of the oxide region 104 and the LK dielectric region 106 is a bottom etch rate. In this way, the oxide region balances the bottom etch rate with the wall etch rate, thus enabling 'cleaner' LK dielectric material removal than when oxide region 104 is not present, for example. In some example, the bottom etch rate is uniform with the wall etch rate. Therefore, the oxide region 104 enhances LK dielectric material removal or etching efficiency, at least because the oxide region 104 mitigates etching selectivity during LK dielectric material removal.

Figure 7A:
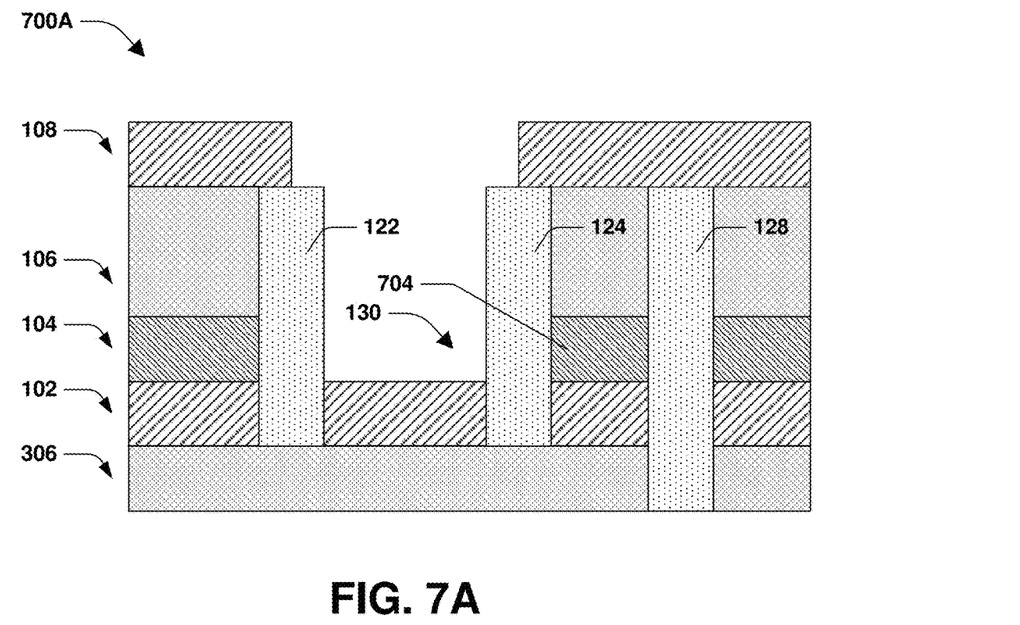
FIG. 7A is a cross-sectional view of an example damascene gap structure, according to some embodiments.
Figure 7B:
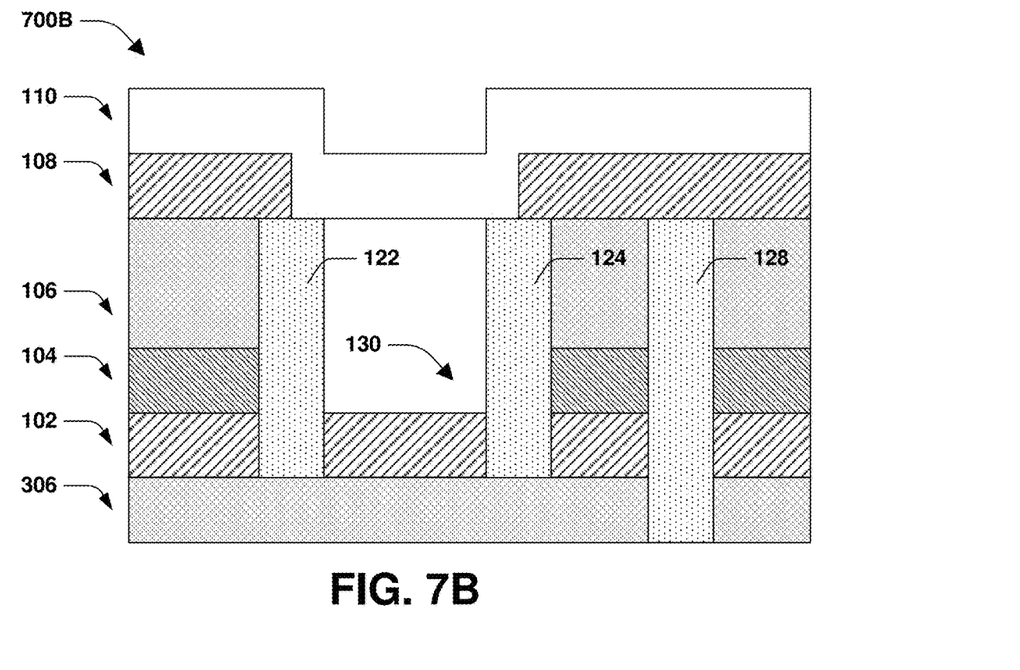
FIG. 7B is a cross-sectional view of an example damascene gap structure, according to some embodiments.

FIG. 7A is a cross-sectional view of an example damascene gap structure 700A, according to some embodiments. For example, the LK dielectric material associated with 610 of FIG. 6B is removed to form a gap 130. Additionally, oxide associated with 610 of FIG. 6B is removed to form the gap 130. It will be appreciated that such oxide facilitates removal of the LK dielectric material associated with 610 of FIG. 6B. However, it will be appreciated that the oxide region 104 remains in other portions of the damascene gap structure 700A of FIG. 7A. For example, oxide 704 of the oxide region 104 not associated with 610 of FIG. 6B is not removed, and thus remains in the damascene gap structure 700A. FIG. 7B is a cross-sectional view of an example damascene gap structure 700B, according to some embodiments. In some embodiments, an ESL seal region 110 is formed over at least one of the second ESL 108, the first metal line 122, the second metal line 124, or the gap 130. For example, the ESL seal region 110 is not flush, at least because a first portion of the ESL seal region 110 is formed over the second ESL 108 and a second portion of the ESL seal region 110 is formed over at least one of the first metal line 122, the second metal line 124, or the gap 130. Accordingly, in some embodiments, the first portion of the ESL seal region 110 is above the second portion of the ESL seal region 110. In some embodiments, the first portion of the ESL seal region 110 is continuous with the second portion of the ESL seal region 110 or formed in a concurrent fashion.

Figure 8A:
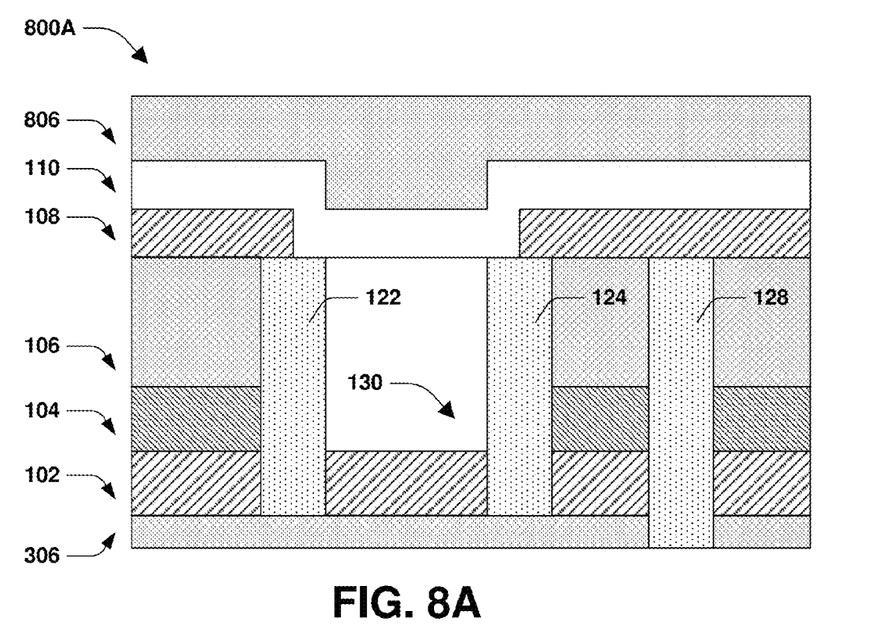
FIG. 8A is a cross-sectional view of an example damascene gap structure, according to some embodiments.
Figure 8B:
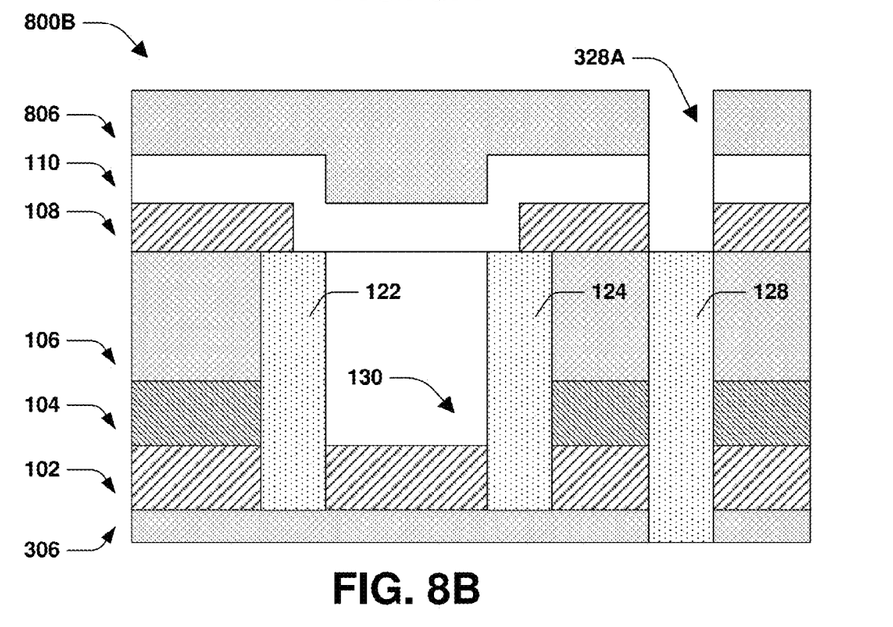
FIG. 8B is a cross-sectional view of an example damascene gap structure, according to some embodiments.

FIG. 8A is a cross-sectional view of an example damascene gap structure 800A, according to some embodiments. In some embodiments, a second set of one or more additional regions 806 is formed above the ESL seal region 110. For example, the second set of one or more additional regions 806 comprises at least one of an etch stop layer (ESL), a low-k (LK) dielectric region, an ESL seal region, an oxide region, etc. Additionally, the second set of one or more additional regions 806 is formed by deposition in some embodiments. FIG. 8B is a cross-sectional view of an example damascene gap structure 800B, according to some embodiments. For example, contact space 328A is formed by removing at least some of at least one of the second ESL 108, the ESL seal region 110, or the second set of one or more additional regions 806. In this way, via 128 is formed, such as by filling contact space 328A with metal, for example.

Figure 9:
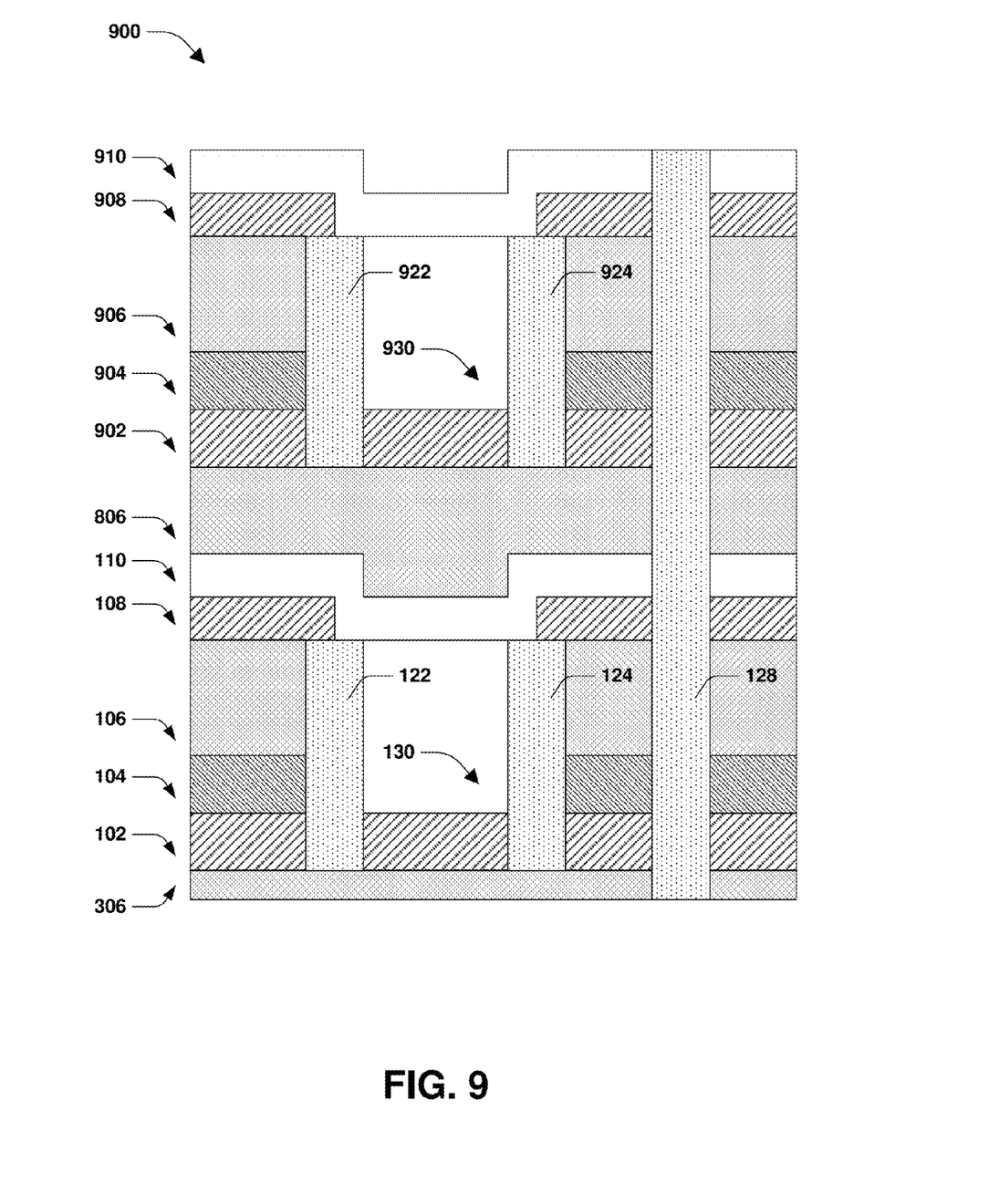
FIG. 9 is a cross-sectional view of an example damascene gap structure, according to some embodiments.

FIG. 9 is a cross-sectional view of an example damascene gap structure 900, according to some embodiments. For example, the damascene gap structure 900 of FIG. 9 comprises two damascene gap structures, such as a first damascene gap structure and a second damascene gap structure. In some embodiments, a first damascene gap structure is associated with at least one of a first set of one or more additional regions 306, a first ESL 102, a first oxide region 104, a first LK dielectric region 106, a second ESL 108, a first ESL seal region 110, a first metal line 122, a second metal line 124, a first gap 130, or via 128. Additionally, a second damascene gap structure is associated with at least one of a second set of one or more additional regions 806, a third ESL 902, a second oxide region 904, a second LK dielectric region 906, a fourth ESL 908, a second ESL seal region 910, a third metal line 922, a fourth metal line 924, a second gap 930, or via 128.

Figure 10:
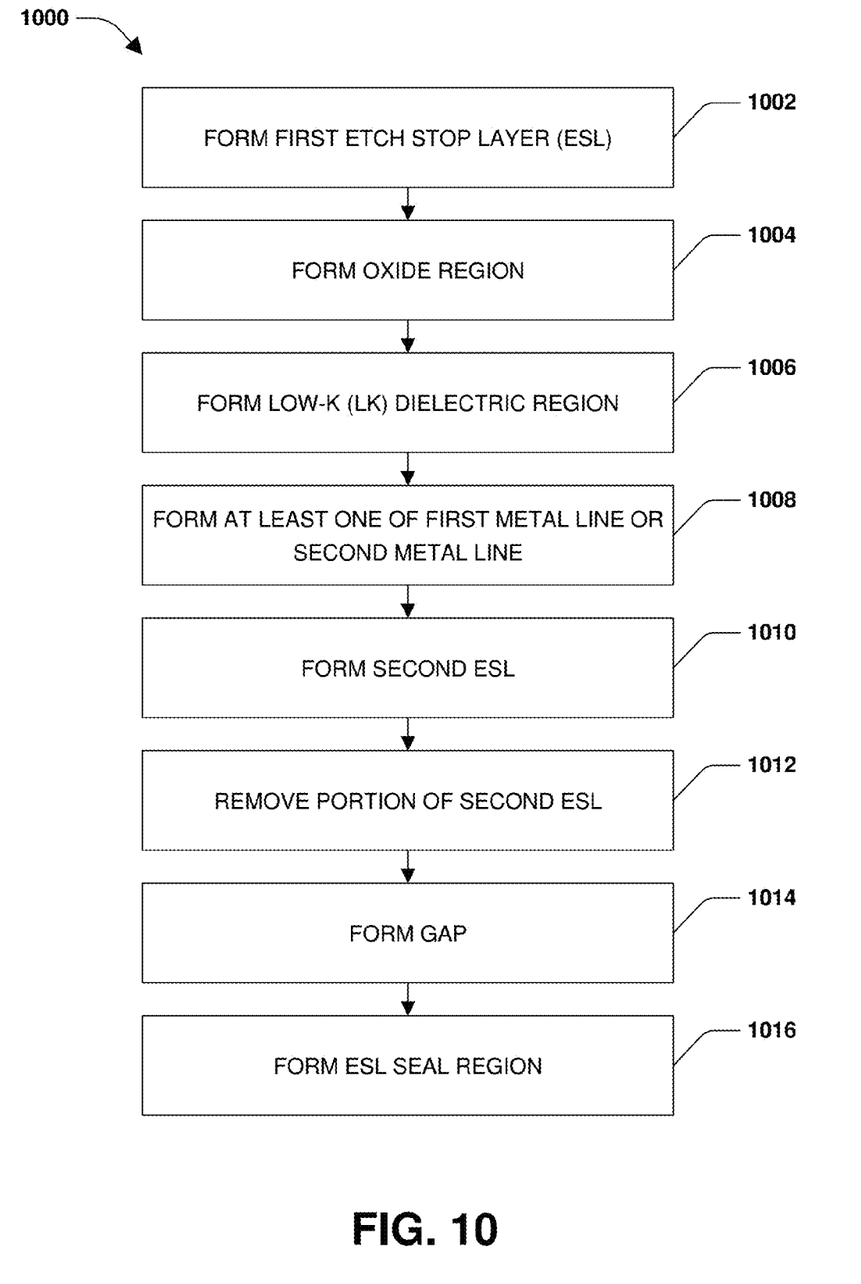
FIG. 10 is a flow diagram of an example method for forming a damascene gap structure, according to some embodiments.

FIG. 10 is a flow diagram of an example method 1000 for forming a damascene gap structure, according to some embodiments. In some embodiments, the method 1000 comprises forming a first etch stop layer (ESL) at 1002. Additionally, the method 1000 comprises forming an oxide region at 1004. For example, the oxide region is formed above the first ESL. At 1006, the method 1000 comprises forming a low-k (LK) dielectric region. In some embodiments, the LK dielectric region is formed above the oxide region. At 1008, a first metal line or a second metal line is formed. According to some aspects, at least one of the first metal line or the second metal line comprise copper. In some embodiments, at least one of the first metal line or the second metal line is formed by performing chemical-mechanical planarization (CMP) on at least one of the LK dielectric region, the first metal line, or the second metal line. In this way, excess metal associated with respective metal lines is removed. In some embodiments, at least one of the first metal line or the second metal line runs through at least one of the first ESL, the oxide region, or the LK dielectric region. At 1010, a second ESL is formed. For example, the second ESL is formed over at least one of the first metal line, the second metal line, or the LK dielectric region. At 1012, a portion of the second ESL is removed. For example, the portion of the second ESL removed is at least one of over at least one of the first metal line or the second metal line or between the first metal line and the second metal line. In some embodiments, the method 1000 comprises removing at least a portion of the second ESL based on photo resist (PR) patterning. At 1014, a gap is formed within the damascene gap structure. For example, the gap is formed by removing at least one of at least a portion of the oxide region between the first metal line and the second metal line or at least a portion of the LK dielectric region between the first metal line and the second metal line. At 1016, an ESL seal region is formed. In some embodiments, the ESL seal region is formed over at least one of the second ESL, the first metal line, the second metal line, or the gap. In some embodiments, at least one of the first ESL or the second ESL comprises dielectric material. In other embodiments, a third metal line is formed between the first metal line and the second metal line. In this way, a first gap and a second gap are formed from the gap.

Figure 11:
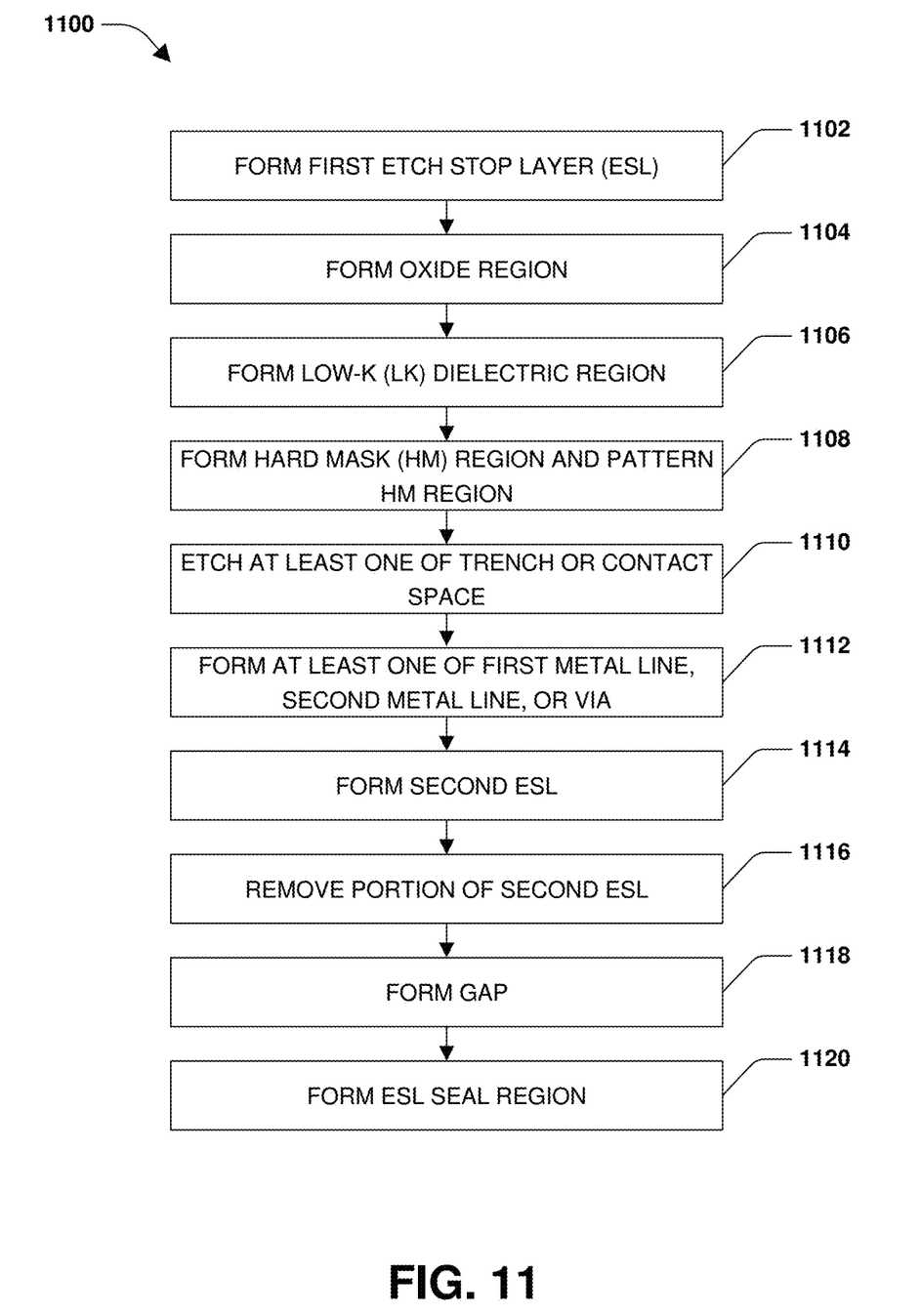
FIG. 11 is a flow diagram of an example method for forming a damascene gap structure, according to some embodiments.

FIG. 11 is a flow diagram of an example method 1100 for forming a damascene gap structure, according to some embodiments. For example, the method 1100 comprises forming a first etch stop layer (ESL) at 1102 and forming an oxide region at 1104. In some embodiments, the oxide region is formed over or above the first ESL. At 1106, a low-k (LK) dielectric region is formed. In some embodiments, the LK dielectric region is formed above the oxide region. At 1108, a hard mask (HM) region is formed. For example, the HM region is formed above the LK dielectric region. Additionally, the HM region is patterned at 1108. At 1110, at least one of a trench or contact space is etched. For example, the method 1100 comprises etching at least one of a first trench, a second trench, or a contact space based on the patterned HM region. According to some aspects, at least one of the first trench or the second trench is formed through at least one of the first ESL, the oxide region, or the LK dielectric region. According to some aspects, the contact space is formed through at least one of the first ESL, the oxide region, the LK dielectric region, or one or more additional regions. In some embodiments, the one or more additional regions comprise a first set of one or more additional regions and a second set of one or more additional regions. For example, the one or more additional regions are not necessarily continuous, as illustrated by the first set of one or more additional regions 306 and the second set of one or more additional regions 806 of FIG. 9. At 1112, at least one of a first metal line, a second metal line, or a via is formed. For example, in some embodiments, the method 1100 comprises at least one of forming a first metal line by filling the first trench with metal, forming a second metal line by filling the second trench with metal, or forming a via by filling the contact space with metal. At 1114, a second ESL is formed. For example, the second ESL is formed over at least one of the first metal line, the second metal line, the via, or the LK dielectric region. At 1116, a portion of the second ESL is removed. In some embodiments, the portion of the second ESL that is removed is located over at least one of the first metal line or the second metal line or between the first metal line and the second metal line. At 1118, a gap is formed. For example, the gap is formed by removing at least one of at least a portion of the oxide region between the first metal line and the second metal line or at least a portion of the LK dielectric region between the first metal line and the second metal line. At 1120, an ESL seal region is formed. For example, the ESL seal region is formed over at least one of the second ESL, the first metal line, the second metal line, the via, or the gap.

One or more techniques or systems for forming a damascene gap structure are provided herein. Generally, a damascene gap structure comprises a gap between a first region and a second region. For example, the gap is formed within a low-k (LK) dielectric region of the damascene gap structure. In some embodiments, the gap is formed by removing LK dielectric material above a first etch stop layer (ESL). In some embodiments, removal of the LK dielectric material is facilitated by an oxide region above the first ESL and below the LK dielectric region. For example, the oxide region enables a first etch rate associated with a bottom of the LK dielectric region, such as a bottom etch rate, to be at least one of uniform or similar to a second etch rate associated with a wall of the LK dielectric region, such as a wall etch rate. In this way, the oxide region below the LK dielectric region facilitates removal of LK material from the LK dielectric region, thus mitigating LK residue during damascene gap structure formation. Additionally, in some embodiments, the first ESL provides structural support for a metal line on a side or a wall of the gap. In some embodiments, the first ESL mitigates dislocation of the metal line, for example.

According to some aspects, a damascene gap structure is provided, comprising a first etch stop layer (ESL), an oxide region above the first ESL, a low-k (LK) dielectric region above the oxide region, a second ESL above the LK dielectric region, and a first ESL seal region above the second ESL. Additionally, the damascene gap structure comprises a second ESL seal region flush with the second ESL and a gap between the first ESL and the second ESL seal region. In some embodiments, the damascene gap structure comprises a first metal line on a first side of the gap. For example, the first metal line is formed under at least one of the second ESL or the second ESL seal region. Additionally, the first metal line is formed through the first ESL. In some embodiments, the damascene gap structure comprises a second metal line on a second side of the gap. For example, the second metal line is formed under at least one of the second ESL or the second ESL seal region. Additionally, the second metal line formed through the first ESL.

According to some aspects, a method for forming a damascene gap structure is provided, comprising forming a first etch stop layer (ESL), forming an oxide region above the first ESL, and forming a low-k (LK) dielectric region above the oxide region. Additionally, the method comprises forming a first metal line through at least one of the first ESL, the oxide region, or the LK dielectric region and forming a second metal line through at least one of the first ESL, the oxide region, or the LK dielectric region. In some embodiments, the method comprises forming a second ESL over at least one of the first metal line, the second metal line, or the LK dielectric region. In some embodiments, the method comprises removing at least a portion of the second ESL at least one of over at least one of the first metal line or the second metal line or between the first metal line and the second metal line. In some embodiments, the method comprises forming a gap by removing at least one of at least a portion of the oxide region between the first metal line and the second metal line or at least a portion of the LK dielectric region between the first metal line and the second metal line. In some embodiments, the method comprises forming an ESL seal region over at least one of the second ESL, the first metal line, the second metal line, or the gap.

According to some aspects, a method for forming a damascene gap structure is provided, comprising forming a first etch stop layer (ESL), forming an oxide region above the first ESL, forming a low-k (LK) dielectric region above the oxide region, forming a hard mask (HM) region above the LK dielectric region, and patterning the HM region. In some embodiments, the method comprises etching at least one of a first trench, a second trench, or a contact space based on the patterned HM region. For example, the first trench is formed through at least one of the first ESL, the oxide region, or the LK dielectric region. For example, the second trench is formed through at least one of the first ESL, the oxide region, or the LK dielectric region. For example, the contact space formed through at least one of the first ESL, the oxide region, the LK dielectric region, or one or more additional regions. In some embodiments, the method comprises forming a first metal line by filling the first trench with metal, forming a second metal line by filling the second trench with metal, and forming a via by filling the contact space with metal. Additionally, the method comprises forming a second ESL over at least one of the first metal line, the second metal line, the via, or the LK dielectric region. In some embodiments, the method comprises removing at least a portion of the second ESL at least one of over at least one of the first metal line or the second metal line or between the first metal line and the second metal line. In some embodiments, the method comprises forming a gap by removing at least one of at least a portion of the oxide region between the first metal line and the second metal line or at least a portion of the LK dielectric region between the first metal line and the second metal line. In some embodiments, the method comprises forming an ESL seal region over at least one of the second ESL, the first metal line, the second metal line, the via, or the gap.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, elements, such as the first etch stop layer (ESL), oxide region, low-k (LK) dielectric region, second ESL, ESL seal region, gap, first metal line, second metal line, third metal line, via, contact space, hard mask (HM), etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method for forming a semiconductor structure, comprising:
    forming a dielectric region;
    etching the dielectric region to form a first trench and a second trench;
    forming a first metal line in the first trench;
    forming a second metal line in the second trench;
    forming an etch stop layer (ESL) over the first metal line, the second metal line, and the dielectric region;
    removing a portion of the ESL between the first metal line and the second metal line;
    removing a portion of the dielectric region between the first metal line and the second metal line to form a gap; and
    forming an ESL seal region over the first metal line, the second metal line, and the gap.

2. The method of claim 1, comprising:
    forming an oxide region prior to forming the dielectric region; and etching the oxide region, wherein the dielectric region and the oxide region define sidewalls of the first trench and the second trench after etching the dielectric region and etching the oxide region.

3. The method of claim 2, comprising:
forming a second ESL prior to forming the oxide region; and
etching the second ESL, wherein the second ESL further defines sidewalls of the first trench and the second trench after etching the second ESL.

4. The method of claim 3, wherein the first metal line and the second metal line define sidewalls of the gap and the second ESL defines a bottom of the gap.

5. The method of claim 1, comprising:
forming a second ESL prior to forming the dielectric region; and
etching the second ESL, wherein the dielectric region and the second ESL define sidewalls of the first trench and the second trench after etching the dielectric region and etching the second ESL.

6. The method of claim 5, wherein the first metal line and the second metal line define sidewalls of the gap and the second ESL defines a bottom of the gap.

7. The method of claim 6, wherein the ESL seal region defines a top of the gap.

8. The method of claim 1, wherein removing the portion of the ESL between the first metal line and the second metal line exposes a portion of a top surface of the first metal line.

9. The method of claim 8, wherein forming the ESL seal region over the first metal line, the second metal line, and the gap comprises forming the ESL seal region to contact the portion of the top surface of the first metal line.

10. The method of claim 1, wherein forming the ESL seal region over the first metal line, the second metal line, and the gap comprises forming the ESL seal region to contact a sidewall of the ESL.

11. The method of claim 1, wherein forming the ESL seal region over the first metal line, the second metal line, and the gap comprises forming the ESL seal region to contact a top surface of the ESL and a sidewall of the ESL.

12. The method of claim 1, comprising:
etching the dielectric region to form a contact space; and
forming a via in the contact space, wherein forming the ESL comprises forming the ESL over the via.

13. The method of claim 12, wherein forming the ESL seal region comprises forming the ESL seal region over the via.

14. The method of claim 13, comprising etching the ESL seal region and the ESL to expose a top surface of the via and to form a second contact space over the via.

15. The method of claim 14, comprising forming a second via in the second contact space.

16. A method for forming a semiconductor structure, comprising:
forming a first etch stop layer (ESL);
forming a dielectric region over the first ESL;
etching the dielectric region and the first ESL to form a first trench and a second trench;
forming a first metal line in the first trench;
forming a second metal line in the second trench;
forming a second ESL over the first metal line, the second metal line, and the dielectric region;
removing a portion of the second ESL between the first metal line and the second metal line;
removing a portion of the dielectric region and a portion of the first ESL between the first metal line and the second metal line to form a gap; and
forming an ESL seal region over the first metal line, the second metal line, and the gap.

17. The method of claim 16, comprising etching the ESL seal region and the second ESL to define a contact space.

18. The method of claim 17, comprising forming a via in the contact space.

19. The method of claim 16, wherein removing the portion of the second ESL between the first metal line and the second metal line exposes a portion of a top surface of the first metal line.

20. A method for forming a semiconductor structure, comprising:
forming a dielectric region;
etching the dielectric region to form a first trench and a second trench;
forming a first metal line in the first trench;
forming a second metal line in the second trench;
forming an etch stop layer (ESL) over the first metal line, the second metal line, and the dielectric region;
removing a portion of the ESL between the first metal line and the second metal line;
removing a portion of the dielectric region between the first metal line and the second metal line to form a gap; and forming an ESL seal region over the first metal line, the second metal line, and the gap, wherein a top of the gap is defined by the ESL seal region and sidewalls of the gap are defined by the first metal line and the second metal line.

* * * * *